(12) United States Patent
Miyamoto

(10) Patent No.: US 9,030,875 B2
(45) Date of Patent: May 12, 2015

(54) NON-VOLATILE MEMORY DEVICE

(71) Applicant: Samsung Electronics Co., Ltd., Suwon-si, Gyeonggi-do (KR)

(72) Inventor: Tomohisa Miyamoto, Yokohama-si (JP)

(73) Assignee: Samsung Electronics Co., Ltd., Suwon-si (KR)

( * ) Notice: Subject to any disclaimer, the term of this patent is extended or adjusted under 35 U.S.C. 154(b) by 231 days.

(21) Appl. No.: 13/716,511

(22) Filed: Dec. 17, 2012

(65) Prior Publication Data

US 2013/0155773 A1    Jun. 20, 2013

(30) Foreign Application Priority Data

Dec. 16, 2011    (JP) .................................. 2011-275702

(51) Int. Cl.
*G11C 16/04* (2006.01)
*G11C 16/06* (2006.01)
*G11C 16/08* (2006.01)
*G11C 16/26* (2006.01)
*G11C 16/32* (2006.01)
*G11C 16/34* (2006.01)

(52) U.S. Cl.
CPC ............ *G11C 16/06* (2013.01); *G11C 16/0483* (2013.01); *G11C 16/08* (2013.01); *G11C 16/26* (2013.01); *G11C 16/32* (2013.01); *G11C 16/3436* (2013.01)

(58) Field of Classification Search
CPC .......... G11C 11/5642; G11C 11/5621; G11C 16/26; G11C 16/10; G11C 2211/5642; G11C 8/10; G11C 16/32
USPC .............................. 365/185.12, 189.05, 233.1
See application file for complete search history.

(56) References Cited

U.S. PATENT DOCUMENTS

| | | | | |
|---|---|---|---|---|
| 6,331,945 | B1 * | 12/2001 | Shibata et al. | ........... 365/185.03 |
| 2007/0121376 | A1 * | 5/2007 | Toda | ........................... 365/185.2 |
| 2007/0236985 | A1 * | 10/2007 | Edahiro et al. | ................ 365/154 |
| 2011/0235431 | A1 * | 9/2011 | Takagiwa | ................. 365/185.22 |

FOREIGN PATENT DOCUMENTS

JP         11-096783        4/1999

* cited by examiner

*Primary Examiner* — Tuan T Nguyen
(74) *Attorney, Agent, or Firm* — Ellsworth IP Group PLLC

(57) ABSTRACT

A non-volatile memory device includes a memory cell array in which a plurality of bit lines intersect a plurality of word lines and a non-volatile memory cell is disposed at each intersection, a page buffer which is provided for each bit line and which includes a latch configured to store data to be written to a memory cell connected to a word line selected from among the plurality of word lines or data read from the memory cell, and a control circuit configured to control a data input time from the bit line to the page buffer and a data detection time of the latch according to a voltage level of a common source line connected to sources of the respective bit lines during an operation of reading data from the memory cell.

20 Claims, 7 Drawing Sheets

FIG. 3

| Operation Mode | Block Sel/Unsel | BLKSEL | GSSL | GSGL | GWL | SSL | SGL | WL Selected Word, Unselected Word | NARS |
|---|---|---|---|---|---|---|---|---|---|
| Write | Selected Block | >Vpgm+Vt | VL | 0V | Vpgm, Others Vpass | VL | 0V | Vpgm, Others Vpass | 0V |
| | Unselected Block | 0V | ← | ← | ← | 0V | Floating | Floating | |
| Erase Stress | Selected Block | Vpass | Vpass | Vpass | ALL 0V | Floating | Floating | ALL 0V | 0V |
| | Unselected Block | 0V | ← | ← | ← | Floating | Floating | Floating | |
| Write Verify /Read | Selected Block | >Vpgm+Vt | Vpass | Vpass | 0V, Others Vpass | Vpass | Vpass | 0V, Others Vpass | LEVEL H |
| | Unselected Block | 0V | ← | ← | ← | 0V | Floating | Floating | |
| Erase Verify | Selected Block | >Vpgm+Vt | Vpass | Vpass | ALL 0V | 0V | Vpass | ALL 0V | LEVEL H |
| | Unselected Block | 0V | ← | ← | ← | 0V | Floating | Floating | |

FIG. 5

NON-VOLATILE MEMORY DEVICE

CROSS-REFERENCE TO RELATED APPLICATIONS

This application claims priority under 35 U.S.C. §119(a) from Japanese Patent Application No. 2011-275702 filed on Dec. 16, 2011, the disclosure of which is hereby incorporated by reference in its entirety.

BACKGROUND

1. Field

Embodiments of the present general inventive concept relate to a non-volatile memory device.

2. Description of the Related Art

When a read operation is performed in a non-volatile memory device, e.g., electrically erasable programmable read-only memory (EEPROM), with a large capacity, data is read in bulk from a plurality of memory cells in a page at one time and output in series. When a write operation is performed on memory cells, data of a page is input in series to the non-volatile memory device and it is written in bulk to a plurality of memory cells at one time. To perform the read or write operation, a plurality of columns, i.e., bit lines are connected to a page buffer including a data latch that temporarily latches data to be read or written.

In NAND-type EEPROM, a write operation is performed on memory cells in a row among a plurality of memory cells arranged in a matrix form of rows and columns. In general, a NAND-type EEPROM cell is a floating gate N-channel metal oxide semiconductor (NMOS) transistor formed in a P-type well at a surface of a semiconductor substrate. The floating gate NMOS transistor includes a source region and a drain region separated from each other in the P-type well, a tunnel oxide layer formed in a channel region between the source region and the drain region, a floating gate formed of polycrystalline silicon on the tunnel oxide layer, and a control gate formed of a dielectric layer on the floating gate.

Memory cells in a column in the matrix form are connected in series with each other, forming a NAND cell string. A first selection transistor is disposed between a first end of the NAND cell string and a bit line and a second selection transistor is disposed between a second end of the NAND cell string and a common source line.

In a write operation, the first selection transistor is turned on and the second selection transistor is turned off, and simultaneously a voltage of 0 V is applied to a bit line when data of 0 is written and a power supply voltage is applied to the bit line when data of 1 is written (when an erased state is maintained). In addition, a program voltage is applied to a word line connected to a selected memory cell and a write-inhibit voltage is applied to a word line connected to an unselected memory cell.

Therefore, a high voltage is applied between a channel and a control gate in a memory cell to which data of 0 is written, so that electrons are injected from the channel to a floating gate. As a result, a threshold voltage of the memory cell shifts from a negative voltage to a positive voltage. Meanwhile, a lower voltage is applied to a channel and a control gate in a memory cell to which data of 1 is written, so that injection of electrons to a floating gate is suppressed. As a result, a threshold voltage of the memory cell is maintained negative.

However, as described above, data is written using tunnel current in NAND-type EEPROM, and therefore, a data write speed is different among memory cells. Accordingly, even through all memory cells have the same write time, some memory cells have a threshold voltage in a normal range of at least 0 V and less than a predetermined voltage (e.g., 5 V) while other memory cells have a threshold voltage greater than the predetermined voltage.

In a read operation of the NAND-type EEPROM, the predetermined voltage (hereinafter, referred to as a read voltage) is applied to the word line connected to the unselected memory cell to turn on the memory cells, but when the memory cell has a threshold voltage greater than the predetermined voltage, the memory cell remains as an off-cell. Therefore, a current path in the NAND cell string is cut off due to the memory cell (that remains as the off-cell), so that data cannot be read from other memory cells connected in series with the memory cell in the NAND cell string.

To solve this problem, approaches for using a cycle of writing, write-verification, and data setup for rewriting in a write operation have been introduced. For a memory cell with a satisfactory threshold voltage, a rewrite data (i.e., data "1") is set at a data latch in a page buffer by the write-verification so that data "0" is not written to the memory cell in a subsequent cycle.

When the write operation is configured as described above, writing to a memory cell with a high write speed is completed quickly, thereby preventing the threshold voltage of the memory cell from increasing afterward. As such, writing and write-verification are continued until data of page is written to all selected memory cells in the NAND-type EEPROM.

In such NAND-type EEPROM, a voltage of a common source line increases and then decreases due to cell current in a read operation or a write-verify operation. Time during which the voltage of the common source line decreases increases as the number of cells (i.e., on-cells) having data of 1 in a page in a column direction increases. As a result, the potential of a bit line does not decrease until the potential of the common source line decreases satisfactorily, and therefore, it is difficult to precisely detect a memory cell state (i.e., on-cell or off-cell) from a latch of a page buffer connected to the bit line.

A technique of detecting a memory cell state even when a voltage of a common source line increases is disclosed in Japanese Patent Laid-open Publication No. 11-96783. A non-volatile memory device disclosed in Japanese Patent Laid-open Publication No. 11-96783 adjusts a voltage of a selected word line based on a voltage of a common source line in a memory cell array during a read operation or a write-verify operation.

In detail, the non-volatile memory device disclosed in Japanese Patent Laid-open Publication No. 11-96783 increases a voltage of a selected word line when the voltage of a common source line increases, thereby easily turning on a selected memory cell with a threshold voltage increased as a memory cell to which data "1" is written. As a result, a bit line connected to the selected memory cell is discharged, making it possible to correctly input the data "1" from the selected memory cell to a page buffer. However, even though the data is correctly input to the page buffer, since a latch in the page buffer detects the data, the data input to the page buffer may be erroneously detected unless the timing of the latch is controlled.

When there is a great number of 1s, for example, when all of memory cells in a page are on-cells, the decreasing time of the voltage of the common source line is longest. Time for which the potential of a bit line decreases (hereinafter, referred to as a bit line development) also increases. Accordingly, it is necessary to delay the timing of data input to a page buffer connected to the bit line and data detection by a latch of the page buffer following the bit line development to be suitable for a case where there are a great number of 1s in order to prevent erroneous data detection. Consequently, time for which data is read from the page buffer is set long.

SUMMARY

The present general inventive concept provides a non-volatile memory device that prevents incorrect data from being written to a latch and reduces total leakage current.

Additional features and utilities of the present general inventive concept will be set forth in part in the description which follows and, in part, will be obvious from the description, or may be learned by practice of the general inventive concept.

The foregoing and/or other aspects and utilities of the present general inventive concept are achieved by providing a non-volatile memory device including a memory cell array in which a plurality of bit lines intersect a plurality of word lines and a non-volatile memory cell is disposed at each intersection, a page buffer which is provided for each bit line and which comprises a latch configured to store data to be written to a memory cell connected to a word line selected from among the plurality of word lines or data read from the memory cell, and a control circuit configured to control a data input time from the bit line to the page buffer and a data detection time of the latch according to a voltage level of a common source line connected to sources of the respective bit lines during an operation of reading data from the memory cell.

The operation of reading the data from the memory cell may be a read operation in a write-verify operation performed to determine whether the data has been written to the memory cell.

The control circuit may include a differential amplifier configured to compare a potential of the common source line with a predetermined reference voltage and to output a detection signal, a timer configured to measure time in response to the detection signal received from the differential amplifier and to output a time signal after a certain time, and a core controller configured to output a first control signal instructing data input from each bit line to the page buffer and a second control signal instructing to detect the input data using the latch when receiving the time signal from the timer.

The non-volatile memory device may further include a register configured to store the reference voltage and the certain time as a result of testing the semiconductor memory device after being manufactured.

The foregoing and/or other aspects and utilities of the present general inventive concept may also be achieved by providing a non-volatile memory device including a memory cell array including a plurality of non-volatile memory cells connected to a plurality of bit lines and a plurality of word lines, a page buffer which is provided for each bit line and which includes a latch configured to latch data to be written to a memory cell connected to a word line selected from among the plurality of word lines or data read from the memory cell, and a control circuit configured to control a latching time of the latch according to a voltage level of a common source line connected to sources of the respective bit lines during an operation of reading data from the memory cell.

The page buffer may further include a first node, and a first switch disposed between the bit line and the first node to control connection and disconnection between the bit line and the first node in response to a first control signal.

The control circuit may include a comparator configured to compare a potential of the common source line with a predetermined reference voltage and to output a detection signal, a timer configured to measure time in response to the detection signal received from the comparator and to output a first time signal after a first time, and a core controller configured to output the first control signal when receiving the first time signal from the timer.

The page buffer may further include a transistor connected between an input node of the latch and the first node, and a second switch connected to the transistor to be turned on or off in response to a second control signal.

The timer may measures time in response to the detection signal received from the comparator and may output a second time signal after a second time, the core controller may output the second control signal when receiving the second time signal from the timer, and the second time may be greater than the first time.

The operation of reading the data from the memory cell may include at least one operation among a read operation in a write-verify operation performed to determine whether the data has been written to the memory cell, an operation of reading the data from the memory cell, and a read operation in an erase-verify operation performed to determine whether the data written to the memory cell has been erased.

The foregoing and/or other aspects and utilities of the present general inventive concept may also be achieved by providing a non-volatile memory device, including a memory cell array including at least one memory cell block that comprises a plurality of non-volatile memory cells connected to a plurality of bit lines and a plurality of word lines, a plurality of page buffers to each correspond to a bit line from among the plurality of bit lines and each comprising a latch to store data to be written to one of the plurality of non-volatile memory cells, and a control circuit to control a data input time from one of the plurality of non-volatile memory cells to one of the plurality of page buffers and a data detection time of the latch based on a number of programmed memory cells or a number of erased memory cells.

During a read operation, the control circuit may monitor a potential of a common source line (CSL) in a selected memory cell block in order to change the data input time according to the monitored potential.

If the number of programmed memory cells greater than a predetermined threshold, a rate at which the potential of the CSL reaches the predetermined reference voltage may increase to increase a rate of data input from the one of the plurality of non-volatile memory cells to the one of the plurality of page buffers.

The controller may control the data to be input from a selected one of the plurality of memory cells into the one of the plurality of page buffers when a potential of the common source line is below a predetermined reference voltage.

The memory cell block comprises a plurality of cell strings, each of the cell strings includes memory cells connected in series and the CSL may be connected to each of the plurality of cell strings.

The control circuit may include a differential amplifier to compare a potential of a common source line (CSL) with a predetermined reference voltage and to output a detection signal, a timer to measure time in response to the detection signal received from the differential amplifier and to output a time signal after a predetermined time, and a core controller to receive the time signal and to output a first control signal to control the data to be input from the one of the plurality of memory cells to the one of the plurality of page buffers and to output a second control signal instructing to detect the input data using the latch when receiving the time signal from the timer.

Each of the plurality of page buffers may include a first node, and a first switch disposed between one of the plurality of bit lines and the first node to control a connection and disconnection between the one of the plurality of bit lines and the first node in response to the first control signal.

Each of the plurality of page buffers may further include a transistor connected between an input node of the latch and the first node, and a second switch connected to the transistor to be turned on or off in response to the second control signal.

The page buffer may be disconnected from the bit line when the first switch is turned off.

The plurality of bit lines may intersect the plurality of word lines and one of the plurality of non-volatile memory cells may be disposed at each intersection.

BRIEF DESCRIPTION OF THE DRAWINGS

These and/or other features and utilities of the present general inventive concept will become apparent and more readily appreciated from the following description of the embodiments, taken in conjunction with the accompanying drawings of which:

FIG. 3 is a diagram of the voltage levels of signals that the row decoder and a switch illustrated in FIG. 2 output to selected and unselected blocks in different operation modes according to an exemplary embodiment of the present general inventive concept;

FIG. 5 is a table illustrating the node state of a latch illustrated in FIG. 4 when data is read from a non-volatile memory cell, according to an exemplary embodiment of the present general inventive concept.

DETAILED DESCRIPTION OF THE PREFERRED EMBODIMENTS

Figure 1:
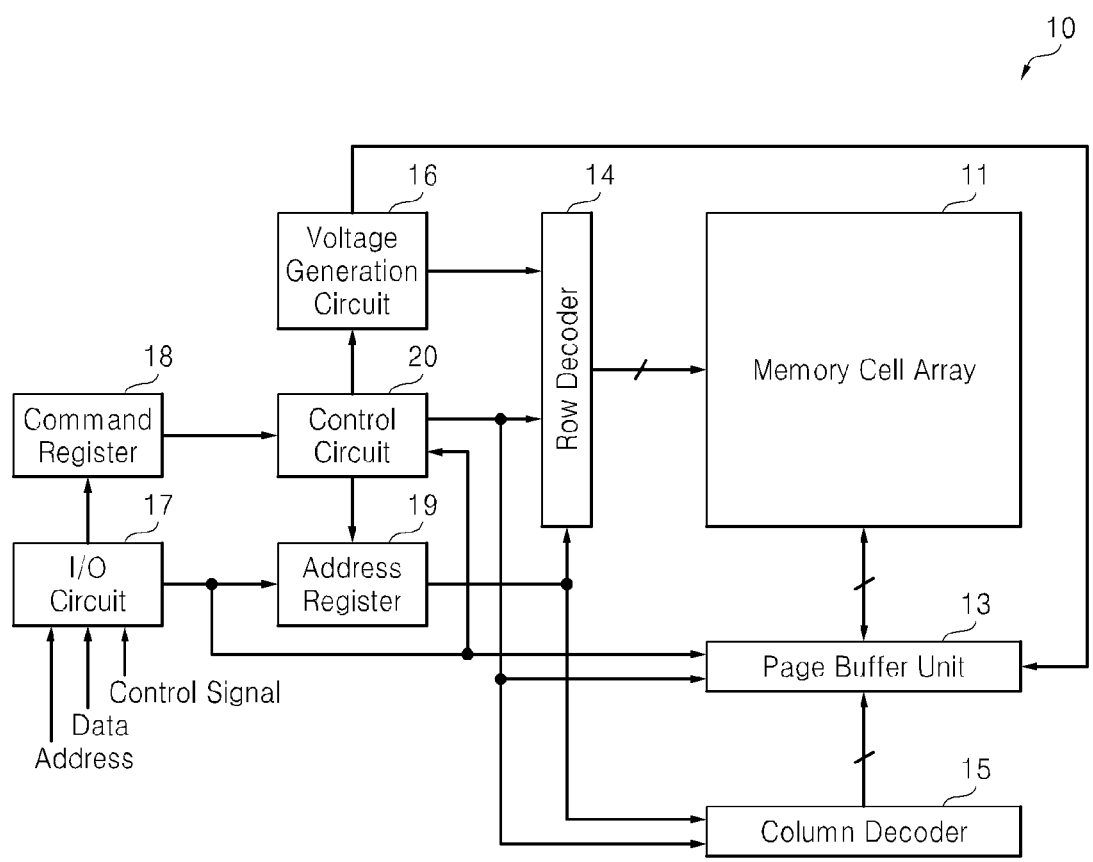
FIG. 1 is a block diagram of a non-volatile memory device according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
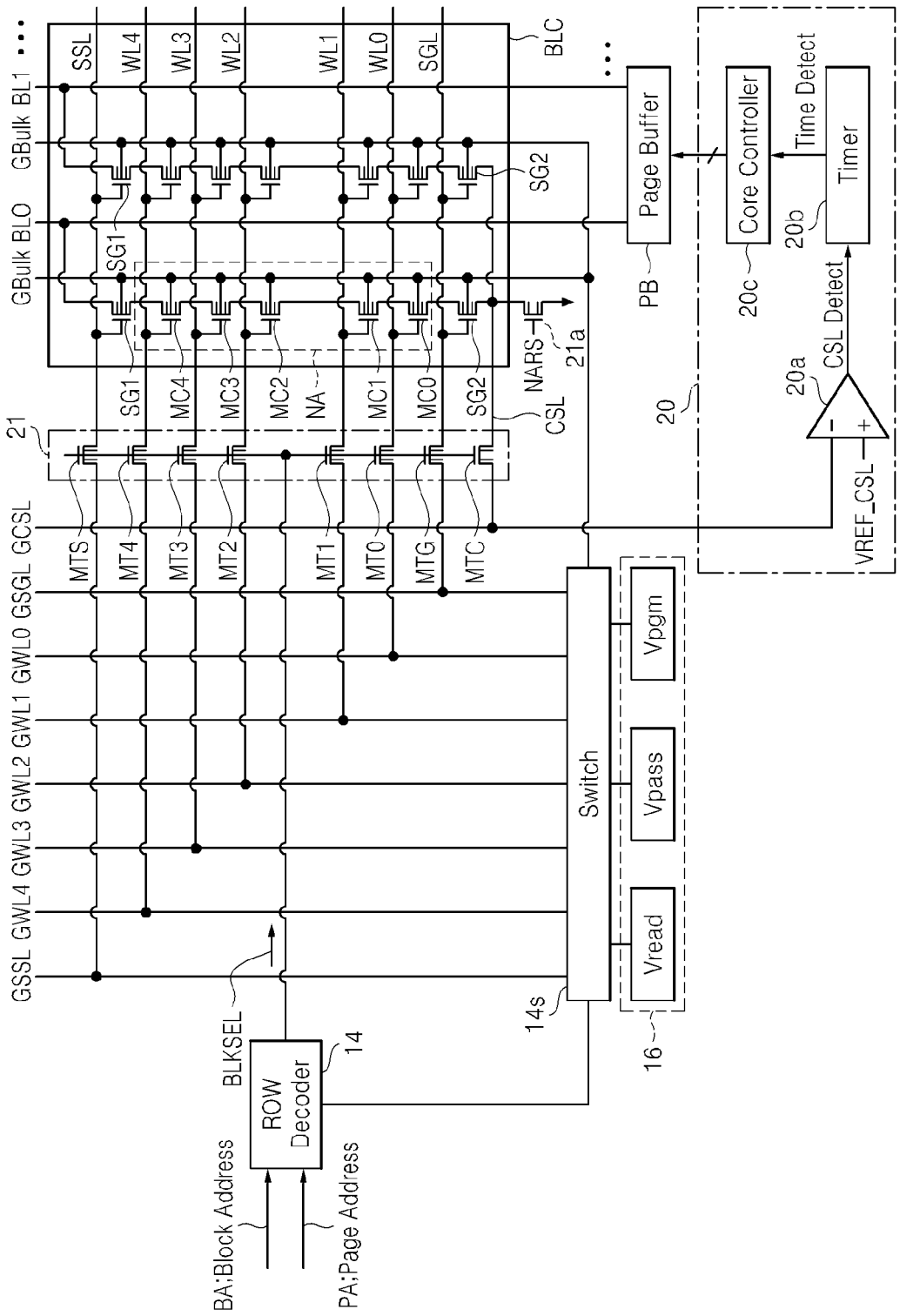
FIG. 2 is a diagram of a memory cell array, a row decoder, a voltage generation circuit, and a page buffer unit illustrated in FIG. 1 according to an exemplary embodiment of the present general inventive concept.

FIG. 1 is a block diagram of a non-volatile memory device 10 according to an exemplary embodiment of the present general inventive concept. The non-volatile memory device 10 is NAND-type electrically erasable programmable read-only memory (EEPROM). FIG. 2 is a diagram of a memory cell block BLC of a memory cell array 11, a page buffer unit 13, a row decoder 14, and a voltage generation circuit 16, as illustrated in FIG. 1, according to an exemplary embodiment of the present general inventive concept.

The memory cell array 11 may include a plurality of blocks BLC or a single block BLC, as illustrated in FIG. 2. Although one memory cell block BLC is illustrated in FIG. 2, the memory cell array 11 may include $2^j$ memory cell blocks BLC (j being a number of bits in a block address BA). The memory cell block BLC may be a unit in which data is erased from memory cells. The memory cell block BLC includes a NAND cell string NA including a plurality of floating-gate transistors, i.e., electrically rewritable non-volatile memory cells MC0 through MC4 connected in series with each other in a column direction.

Referring to FIG. 2, although there are five memory cells MC0 through MC4 in the NAND cell string NA in the exemplary embodiment illustrated in FIG. 2, the number of memory cells illustrated is merely exemplary. As such, the NAND cell string NA may include $2^h$ serially-connected non-volatile memory cells (h being a bit number of a page address PA).

The NAND cell string NA is arranged in a row direction with respect to the memory cell array 11 and corresponding to bit lines BL0 and BL1. Although only two bit lines BL0 and BL1 are illustrated in FIG. 2, the number of bit lines is merely exemplary. Conventionally, a number of bit lines is determined by a number of bits in an externally input column address and a number of bits in externally input data. As described above, the memory cell block BLC includes a plurality of NAND cell strings NA.

A gate of each of non-volatile memory cells in a row in the memory cell block BLC is connected to one of a plurality of word lines (e.g., WL0 through WL4) perpendicular to bit lines (e.g., BL0 and BL1).

A selection transistor SG1 that connects or disconnects a bit line and a NAND cell string NA is disposed between the bit line and a first end of the NAND cell string NA. A selection transistor SG2 that connects or disconnects a common source line CSL and the NAND cell string NA is disposed between the common source line CSL and a second end of the NAND cell string NA.

The selection transistors SG1 and SG2 may be N-channel metal oxide semiconductor (NMOS) transistors. Gate electrodes of the selection transistors SG1 and SG2 are connected to selection gate signals SSL and SGL disposed in parallel with the word lines WL. A MOS transistor 21a is connected to and disposed between the common source line CSL and a ground to be connected to or disconnected from a selection signal NARS.

When data is read from the non-volatile memory cells MC0 through MC4, the selection gate signals SSL and SGL and the selection signal NARS become high (H level). As a result, the first end of each NAND cell string NA is connected to a bit line and the second end thereof is grounded.

When data is written into the non-volatile memory cells MC0 through MC4, the selection gate signals SSL and SGL become high (level H) and the selection signal NARS become low (L level). As a result, a channel in the NAND cell string NA is precharged with a voltage provided from the page buffer unit 13 to the bit line.

The range of non-volatile memory cells selected by a single word line is a single page which is a unit of a read/write operation.

A cell transistor (i.e., the non-volatile memory cell MC0 through MC4) has a threshold voltage corresponding to data stored therein. In a single-cell NAND-type EEPROM, a state in which a cell transistor is a depletion (D) type is conventionally defined as a data "0" retention state (i.e., an erased state) corresponding to a storage of data "1," and a state in which a cell transistor is an enhancement (E) type is conventionally defined as a data "1" retention state (i.e., a write state) corresponding to a storage of data "0."

In a write operation, a threshold voltage of a cell transistor retaining data "1" shifts in a positive direction to retain data "0." In an erase operation, a threshold voltage of a cell transistor retaining data "0" shifts in a negative direction to retain data "1."

Referring back to FIG. 1, the page buffer unit 13 includes a plurality of page buffers (which will be described later) installed at respective bit lines in order to perform a write operation and a read operation on data of a page. Each of the page buffers in the page buffer unit 13 includes a latch circuit used as a sense amplifier circuit, which is connected to a bit line and amplifies and detects a potential of the bit line.

The row decoder 14 selects a word line in the memory cell array 11. The column decoder 15 selects a bit line in the memory cell array 11 and a page buffer. The voltage generation circuit 16 generates various voltages used to write data to, erase data from, and read data from non-volatile memory cells, for example, by boosting the power supply voltage.

An input/output (I/O) circuit 17 transmits an externally input address to an address register 19, transmits command data indicating an externally input command to a command register 18, and transmits an externally input control signal to a control circuit 20. In addition, the I/O circuit 17 transmits externally input data to each page buffer in the page buffer unit 13 and outputs data read from non-volatile memory cells through the page buffer PB.

The address register 19 stores an address received from the I/O circuit 17 and transmits the address to the row decoder 14 and the column decoder 15. The command register 18 stores command data received from the I/O circuit 17 and transmits it to the control circuit 20.

The control circuit 20 controls write, read, erase, and verify operations of the non-volatile memory cells MC0 through MC4 according to a control signal received from the I/O circuit 17 and command data received from the command register 18.

The control signal may be an external clock signal, a chip enable signal, a command latch enable signal, an address latch enable signal, a write enable signal, or a read enable signal. The control circuit 20 outputs an internal control signal to each circuit based on the control signal in response to an operation mode indicated by the command data.

The control circuit 20 also determines whether data is successfully written or erased based on data written to a latch in each of the page buffers in the page buffer unit 13.

As illustrated in FIG. 2, the control circuit 20 includes a differential amplifier (or comparator) 20a, a timer 20b, and a control signal generator (also referred to as a core controller) 20c. During a read operation (i.e., a read operation, a write-verify operation, or an erase-verify operation) the control circuit 20 monitors a potential of the common source line CSL in a selected memory cell block BLC and changes an input time of a control signal to the page buffer unit 13 according to the monitored potential.

The row decoder 14 decodes the block address BA stored in the address register 19 and outputs a block selection signal BLKSEL corresponding to a decoding result to a gate of a transfer transistor unit 21 corresponding to each memory cell block BLC. The voltage level of the block selection signal BLKSEL is the level of a voltage generated by the voltage generation circuit 16 controlled by the control circuit 20 and is the voltage level corresponding to a selected block or an unselected block in each operation mode. As illustrated in FIG. 2, the transfer transistor unit 21 includes NMOS transistors MT0 through MT4, MTS, MTG, and MTC and is provided to correspond to each memory cell block BLC.

The row decoder 14 decodes the page address PA stored in the address register 19, and it applies supply voltages to internal word signals GWL0 through GWL4 through a switch 14s and outputs the internal word signals GWL0 through GWL4 to drains, respectively, of the transistors MT0 through MT4 according to a decoding result. The row decoder 14 also applies the supply voltages to internal selection gate signal GSSL and GSGL through the switch 14s and outputs the internal selection gate signal GSSL and GSGL to drains, respectively, of the transistors MTS and MTG in the transfer transistor unit 21.

Each voltage level of the internal word signals GWL0 through GWL4 and the internal selection gate signal GSSL and GSGL corresponds to a level of a voltage generated by the voltage generation circuit 16 controlled by the control circuit 20, and also corresponds to each mode.

The transfer transistor unit 21 corresponding to each memory cell block BLC transmits the output of the row decoder 14 according to the voltage level of the block selection signal BLKSEL. A voltage level corresponding to an operation mode is applied to each of the lines corresponding to the selection gate signal and the selection gate signal SGL and the word lines WL0 through WL4, which are connected gates, respectively, in each of a plurality of NAND cell strings in the memory cell block BLC.

The drain of the NMOS transistor MTC is connected to a global common source line GCSL installed in common corresponding to all memory cell blocks BLC. When the row decoder 14 selects a particular memory cell block BLC, the common source line CSL of the memory cell block BLC is connected to the global common source line GCSL and the potential of the common source line CSL is input to an inverting input terminal of the differential amplifier 20a.

Figure 5:
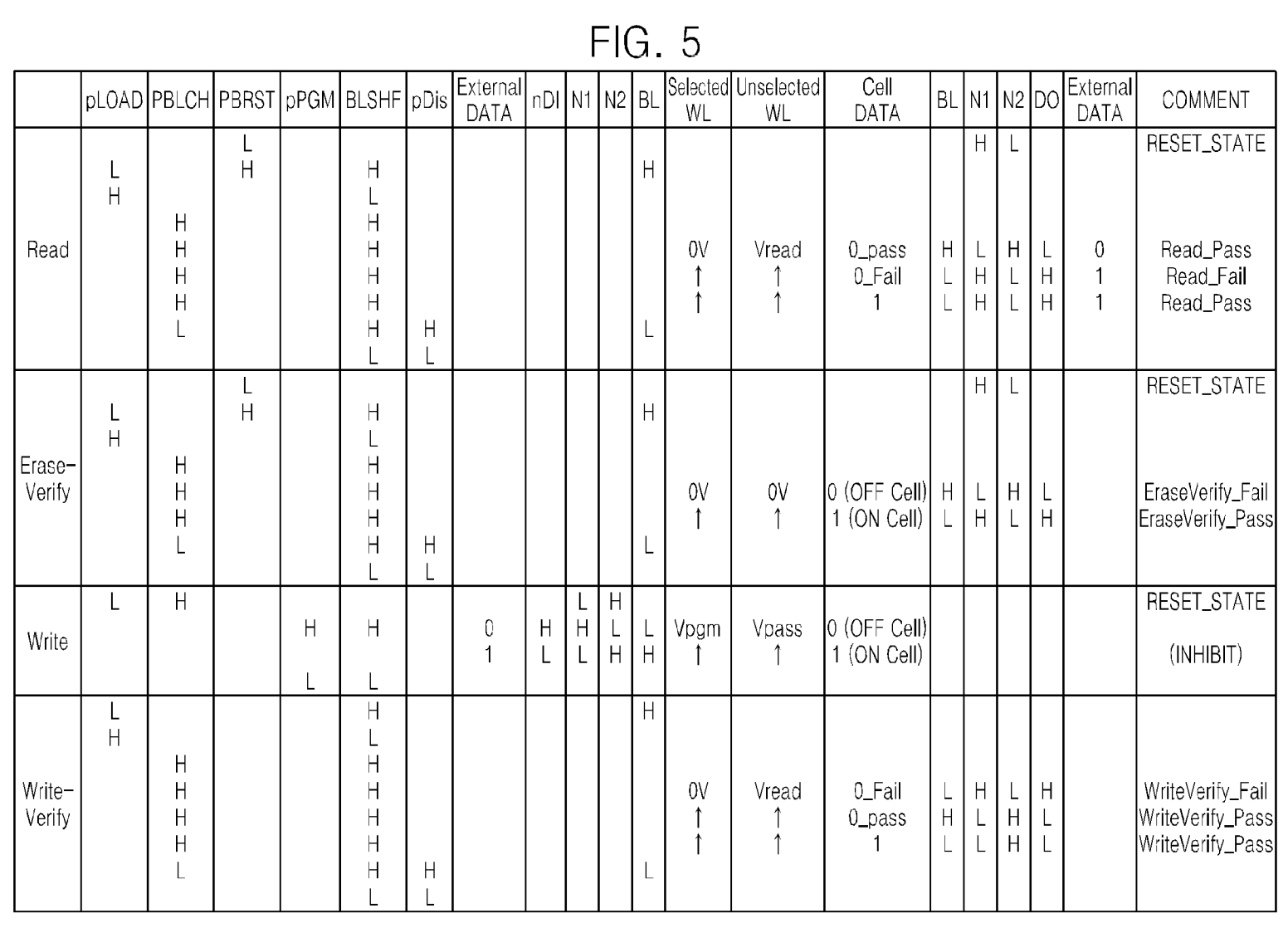

FIG. 3 is a diagram of the voltage levels of signals input to selected and unselected blocks in different operation modes among blocks BLC provided with a voltage by the row decoder 14 according to an exemplary embodiment of the present general inventive concept. In FIGS. 3 and 5, arrow (↑) means "same as above".

The selection of a selected block and an unselected block in different operation modes will be described with reference to FIGS. 2 and 3 below.

Block Selection in a Write-Verify Operation

In a write operation mode (data write operation), the row decoder 14 outputs the block selection signal BLKSEL to the transfer transistor unit 21 of one selected memory cell block BLC from among a plurality of memory cell blocks BLC, with respect to the block address BA. The block selection signal BLKSEL has a voltage level that is higher than a program voltage Vpgm by at least a threshold voltage Vt of a transfer transistor in the transfer transistor unit 21. The row decoder 14 outputs the block selection signal BLKSEL having 0 V to the remaining blocks BLC (hereinafter, referred to as unselected blocks BLC). Accordingly, an output of the switch 14s is input only to the selected memory cell block BLC.

The selection gate signal SSL input to each unselected memory cell block BLC is fixed to 0 V by an NMOS transistor MTN (not illustrated in FIG. 2) having a gate to which a logically inverted signal /BLKSEL of the block selection signal BLKSEL output from the row decoder 14 is applied. Voltage levels of the selection gate signal SGL and the word lines WL0 through WL4 input to the unselected memory cell block BLC each become a floating voltage to turn off the transfer transistor unit 21 corresponding to the unselected memory cell block BLC.

The switch 14s outputs the internal word signals GWL having a write-inhibit voltage Vpass, the internal selection gate signal GSSL having a low voltage (lower than a power supply voltage VCC), and the internal selection gate signal GSGL having 0 V to the transfer transistor unit 21 corresponding to each memory cell block BLC. Since the transfer transistor unit 21 corresponding to the selected block BLC remains in an on-state, the selection gate signals SSL and SGL input to the selected memory cell block BLC and the word lines WL0 through WL4 each has the same voltage level as a corresponding signal output from the switch 14s. The control circuit 20 outputs the selection signal NARS having 0 V, thereby turning off the MOS transistor 21a.

Thereafter, the page buffer unit 13 applies an H level (level of the power supply voltage VCC) as data "1" or an L level (0 V) as data "0" to each bit. Accordingly, in response to the voltage level applied to each bit line of the selected memory cell block BLC, a channel of each of transistors respectively forming non-volatile memory cells connected in series in each NAND cell string NA is precharged. Thereafter, the switch 14s provides the program voltage Vpgm to a word line (which is designated by the page address PA and hereinafter, referred to as a selected word line) among the word lines WL0 through WL4. In the non-volatile memory cell to which data "0" is provided, electrons are injected from a channel maintained at a voltage level of 0 V to a floating gate to shift a threshold voltage in a positive direction, thereby writing the data "0."

Injection of electrons does not occur in a non-volatile memory cell to which data "1" will be written, and therefore, there is no change in a threshold voltage and the storage state of data "1" (i.e., the erased state) is maintained. The write-inhibit voltage Vpass is applied to each of word lines (hereinafter, referred to as unselected word lines) other than the selected word line from among the word lines WL0 through WL4. Accordingly, there is no electron injection and no change in a threshold voltage and the data "0" or "1" is maintained in a non-volatile memory cell connected to the unselected word line.

In contrast, in the unselected memory cell block BLC, the selection transistor SG1 is turned off. Therefore, a channel in each of the non-volatile memory cells MC0 through MC4 that are connected in series in each NAND cell string NA is not precharged and voltage levels of the word lines WL0 through WL4 each become a floating voltage. Accordingly, the threshold voltages of the non-volatile memory cells MC0 through MC4 do not fluctuate and the data "0" or "1" is maintained.

The switch 14s sets the internal word signals GWL and the internal selection gate signal GSSL and GSGL to 0 V. However, the row decoder 14 maintains the voltage level of the block selection signal BLKSEL. The control circuit 20 outputs the selection signal NARS at an H level, thereby turning on the MOS transistor 21a.

In a write-verify operation mode following the write operation mode, the page buffer unit 13 applies an H level to each bit line. The switch 14s applies 0 V to the selected word line and a read voltage Vread to the unselected word line.

Accordingly, a NAND cell string NA including a non-volatile memory cell into which data "0" has not been written, among non-volatile memory cells to which data "0" or "1" must be written during a read operation, forms a current path to the ground so that the voltage level of the bit line becomes 0 V.

Meanwhile, a NAND cell string NA including a non-volatile memory cell to which the data "0" has been written, a current path to the ground is not formed and the voltage level of a bit line is maintained at the H level.

In the former case, a latch LT of a page buffer PB stores FAIL data indicating that data writing to the non-volatile memory cell has not normally been performed. In the latter case, the latch LT stores PASS data indicating that data writing to the non-volatile memory cell has normally been performed.

Similarly to the NAND cell string NA including the non-volatile memory cell to which the data "0" has not been written, a current path to the ground is formed, making the voltage level of a bit line 0 V in a NAND cell string NA including a non-volatile memory cell storing the data "1" given by a page buffer PB in the previous write operation. However, in this case, the latch LT of the page buffer PB stores the PASS data indicating that the data of the nonvolatile memory cell is properly written.

Block Selection in an Erase-Verify Operation

In an erase operation mode, the row decoder 14 outputs the block selection signal BLKSEL having the write-inhibit voltage Vpass to the transfer transistor unit 21 of a selected memory cell block BLC from among a plurality of memory cell blocks BLC based on the block address BA. The row decoder 14 outputs the block selection signal BLKSEL having 0 V to the remaining unselected blocks BLC. Accordingly, a voltage generated by the voltage generation circuit 16 is supplied only to the selected memory cell block BLC.

The switch 14s outputs the internal word signal GWL having 0 V and the internal selection gate signals GSSL and GSGL having the write-inhibit voltage Vpass to the transfer transistor unit 21 corresponding to each memory cell block BLC. Since the transfer transistor unit 21 for the selected memory cell block BLC remains in the on-state, the selection gate signals SSL and SGL input to the selected memory cell block BLC become a floating voltage that is lower than the write-inhibit voltage Vpass by the threshold voltage of a transfer transistor. The voltage level of the word lines WL0 through WL4 input to the selected memory cell block BLC is 0 V.

Thereafter, the control circuit 20 outputs the selection signal NARS having 0 V, thereby turning off the MOS transistor 21a, so that the common source line CSL is set to the floating voltage and the voltage generation circuit 16 applies a high voltage (e.g., 20 V) to a P-well in which every memory cell block BLC is formed. Accordingly, electrons are discharged from a floating gate to the P-well in all non-volatile memory cells MC0 through MC4 in the selected block BLC, so that the non-volatile memory cells have the threshold voltage changing into a negative voltage and become the storage state of data "1," i.e., the erased state.

Meanwhile, in each unselected memory cell block BLC, the voltage level of the word lines WL0 through WL4 corresponds to the floating voltage, and therefore, the floating gate of a non-volatile memory cell is boosted. As a result, electrons are not discharged from the floating gate to the P-well. In other words, the threshold voltage of the non-volatile memory cell does not fluctuate and the non-volatile memory cell is kept at the storage state of data "0" or "1." The switch 14s sets the internal selection gate signals GSSL and GSGL to 0 V. The voltage generation circuit 16 resets the voltage of the P-well to a normal voltage (e.g., 0 V or a negative voltage). At the same time, the control circuit 20 outputs the selection signal NARS at H level, thereby turning on the MOS transistor 21a and setting the common source line CSL to 0 V.

In an erase-verify operation mode, the page buffer unit 13 provides an H level to each bit line. The row decoder 14 outputs the block selection signal BLKSEL having a voltage higher than the write-inhibit voltage Vpass by at least the threshold voltage Vt of a transfer transistor (i.e., a voltage>Vpass+Vt) to the transfer transistor unit 21 to correspond to the selected memory cell block BLC. In addition, the row decoder 14 outputs the block selection signal BLKSEL having 0 V to an unselected memory cell block BLC. The switch 14s applies the write-inhibit voltage Vpass to the internal selection gate signal GSSL and GSGL. As a result, the selection gate signals SSL and SGL that are input to the selected memory cell block BLC have the write-inhibit voltage Vpass.

The voltage of the word lines WL0 through WL4 input to the selected memory cell block BLC is maintained at 0 V. Meanwhile, the selection gate signal SSL input to the unselected memory cell block BLC becomes 0 V in response to the logically inverted signal/BLKSEL of the block selection signal BLKSEL, similar to the write operation and the write-verify operation.

Accordingly, during the erase operation, a NAND cell string NA including non-volatile memory cells into which the data "1" is written forms a current path to a ground and a voltage level of its bit line becomes 0 V. Meanwhile, a NAND cell string NA including any non-volatile memory cell to which data "1" has not been written does not form the current path to the ground, and the voltage level of the bit line is maintained at the H level.

In the former case, a latch LT of a page buffer PB stores FAIL data indicating that data writing to the non-volatile memory cell has not normally been performed. In the latter case, the latch LT stores PASS data indicating that data writing to the non-volatile memory cell has normally been performed.

Since the selection gate signal SSL input to the unselected memory cell block BLC is 0 V, a NAND cell string NA is not connected to a bit line and does not form a current path to the ground.

Block Selection in an Erase-Verify Operation

In a read operation mode, the row decoder 14 outputs the block selection signal BLKSEL having a voltage level higher than the write-inhibit voltage Vpass by at least the threshold voltage Vt of a transfer transistor to the transfer transistor unit 21 corresponding to a selected memory cell block BLC based on the block address BA. The row decoder 14 outputs the block selection signal BLKSEL having 0 V to other unselected memory cell blocks BLC. Accordingly, an output of the switch 14s is supplied only to the selected memory cell block BLC.

The selection gate signal SSL input to each unselected memory cell block BLC is fixed to 0 V by the NMOS transistor MTN having a gate to which the logically inverted signal/BLKSEL of the block selection signal BLKSEL output from the row decoder 14 is applied. The voltage level of the selection gate signal SGL and the word lines WL0 through WL4 input to the unselected block BLC corresponds to a floating voltage since the transfer transistor unit 21 corresponding to the unselected memory cell block BLC is in the off-state. The control circuit 20 outputs the selection signal NARS at an H level, thereby turning on the MOS transistor 21a and setting the common source line CSL to 0 V.

The page buffer unit 13 applies an H level to each bit line. The switch 14s applies 0 V to a selected word line and the read voltage Vread to an unselected word line. As a result, a NAND cell string NA, in which data "1" has been written to a non-volatile memory cell connected to the selected word line in the write operation, forms a current path to the ground, so that a corresponding bit line becomes 0 V.

Meanwhile, a NAND cell string NA, in which data "0" has been written to a non-volatile memory cell connected to the selected word line in the write operation, does not form a current path to the ground, so that a corresponding bit line maintains the H level. As will be described later, data "0" or "1" is output according to the voltage level of a bit line. In the unselected memory cell block BLC, the selection gate signal SSL is 0V, and therefore, a NAND cell string NA is not connected to a bit line and does not influence the change in the voltage corresponding to the bit line.

Figure 4:
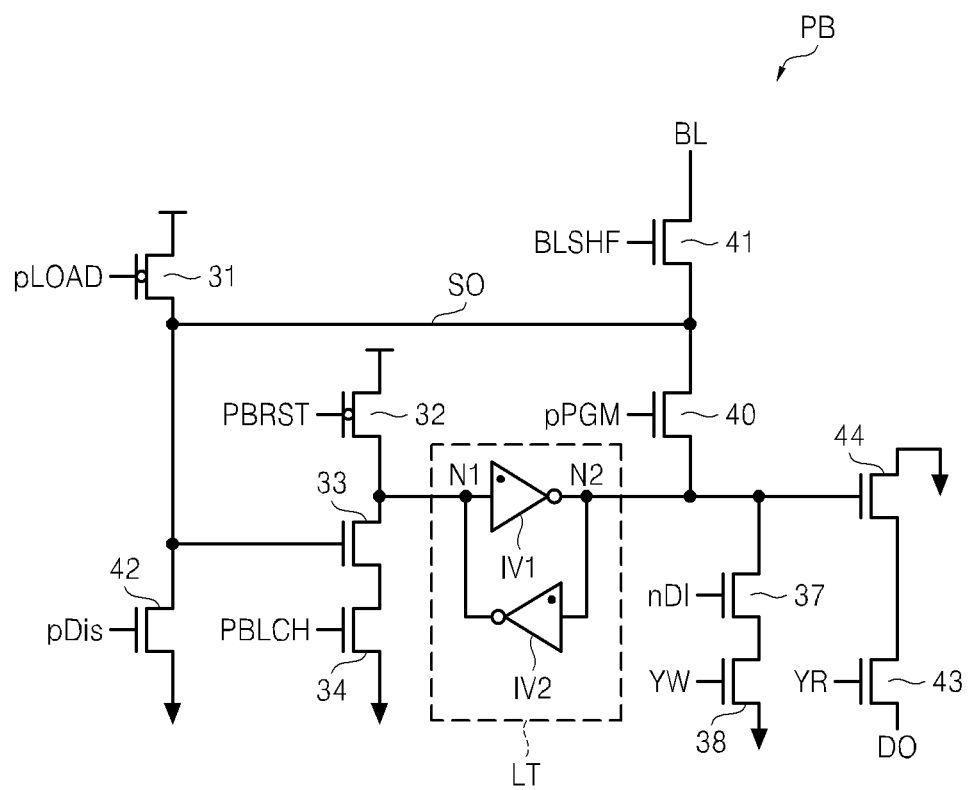
FIG. 4 is a circuit diagram of a page buffer PB included in the page buffer unit illustrated in FIG. 1 according to an exemplary embodiment of the present general inventive concept.

The structure and the operations of the page buffer unit 13 illustrated in FIG. 1 will be described in detail with reference to FIGS. 4 and 5. FIG. 4 is a circuit diagram of a page buffer PB included in the page buffer unit 13 illustrated in FIG. 1 according to an exemplary embodiment of the present general inventive concept. Accordingly, the column decoder 15 decodes an externally input p-bit column address indicating the position of a bit line and outputs $2^p(=q)$ column address signals. When external data input to the I/O circuit 17 is "w" bits in length, the number of bit lines BL is (w×q).

The page buffer PB is provided to correspond to each of the bit lines BL. In the current embodiments, the number "w" of bits in data is 1 and a data write line nDI and a data read line DO are connected in common to page buffers PB in the page buffer unit 13.

A column address signal YW is a signal that is input to the page buffer PB during a write operation. A column address signal YR is a signal that is input to the page buffer PB during a read operation. In other words, the column decoder 15 outputs the column address signal YW in response to an externally input column address, so that data in the data write line nDI is input to the page buffer PB. The column decoder 15 also outputs the column address signal YR in response to an externally input column address, so that data is output from the page buffer PB to the data read line DO.

Since each of the page buffers PB in the page buffer unit 13 have the same structure, the structure of a single page buffer PB will be described below. The page buffer PB includes transistors 31, 32, 33, 34, 37, 38, 40, 41, 42, 43, and 44 and a latch LT. The transistors 31 and 32 are P-channel MOS (PMOS) transistors. The other transistors 33 through 38 and 40 through 44 are NMOS transistors. The latch LT includes inverters IV1 and IV2. An output terminal of the inverter IV1 is connected to an input terminal of the inverter IV2 through a node N2. An input terminal of the inverter IV1 is connected to an output terminal of the inverter IV2 through a node N1.

The transistor 31 has a source connected to a power supply line, a gate connected to a line for control signal pLOAD, and a drain connected to a node SO. The transistor 32 has a source connected to the power supply line, a gate connected to a line corresponding to a control signal PBRST, and a drain connected to the node N1. The transistor 33 has a drain connected to the node N1, a gate connected to the node SO, and a source connected to a drain of the transistor 34. The transistor 34 has the drain connected to the source of the transistor 33, a gate connected to a line for a control signal PBLCH, and a source connected to the ground.

The transistor 37 has a drain connected to the node N2, a gate connected to the data write line nDI, and a source connected to a drain of the transistor 38. The transistor 38 has the drain connected to the source of the transistor 37, a gate connected to a line for the column address signal YW, and a source connected to the ground.

The transistor 40 has a drain connected to the node SO, a gate connected to a line corresponding to a control signal pPGM, and a source connected to the node N2. The transistor 41 has a drain connected to a bit line BL, a gate connected to a line corresponding to a control signal BLSHF, and a source connected to the node SO. The transistor 42 has a drain connected to the node SO, a gate connected to a line corresponding to a control signal pDis, and a source connected to the ground.

The transistor 43 has a drain connected to the data read line DO, a gate connected to a line for the column address signal YR, and a source connected to a drain of the transistor 44. The transistor 44 has the drain connected to the source of the transistor 43, a gate connected to the node N2, and a source connected to the ground. The other page buffers PB have the above-described structure.

FIG. 5 is a table illustrating states of the nodes N1 and N2 of the latch LT according to an operation mode of the data stored in a non-volatile memory cell. The operations of the page buffer PB will be described with reference to FIG. 5 below.

Read Operation

During a read operation, command data indicating the read operation is externally input to the non-volatile memory device 10 and data indicating a read mode is set in the command register 18. The control circuit 20 outputs a control signal to control each circuit based on the data. In an initial state, the control circuit 20 sets the control signals PBLCH, pPGM, BLSHF, and pDis to an L level and the control signals pLOAD and PBRST to an H level. The column decoder 15 sets the column address signals YW and YR to an L level.

When data is read from a non-volatile memory cell, the control circuit 20 changes the control signal PBRST to an L level so as to forcefully apply data of an H level to the node N1, thereby performing a reset operation to prepare to read data from the non-volatile memory cell. As a result, the data of the H level is written to the node N1 and data of the L level is written to the node N2 in the latch LT, so that reset data is stored in the latch LT. The control circuit 20 changes the control signal PBRST to the H level to turn off the transistor 32 and finishes the reset operation regarding RESET_STATE, as illustrated in FIG. 5.

Thereafter, the control circuit 20 changes the control signal pLOAD to the L level and the control signal BLSHF to the H level. As a result, the transistors 31 and 41 are turned on and the bit line BL is precharged to the H level through the transistors 31 and 41.

The row decoder 14 selects one of a plurality of memory cell blocks BLC and sets a selected word line of the selected memory cell block BLC to 0 V. The row decoder 14 also applies the read voltage Vread generated by the voltage generation circuit 16 to unselected word lines other than the selected word line so as to turn on all non-volatile memory cells whose gates are connected to the unselected word lines, respectively.

Thereafter, the control circuit 20 changes the control signal pLOAD to level H and the control signal BLSHF to the L level. As a result, when a non-volatile memory cell connected to the selected word line has data "0," the non-volatile memory cell is in the off-state and the bit line BL is maintained at the H level. Contrarily, when the non-volatile memory cell has data "1" (i.e., when the threshold voltage of the non-volatile memory cell is negative since the non-volatile memory cell is in the erased state or when the threshold voltage is less than the read voltage Vread since data "0" has not properly been written to the non-volatile memory cell), the non-volatile memory cell becomes the on-state and the bit line changes to the L level.

Thereafter, the control circuit 20 changes the control signal BLSHF to the H level. As a result, the transistor 41 is turned on to connect the bit line BL to the node SO, so that the level of the node SO becomes equal to the potential of the bit line BL. The control circuit 20 changes the control signal PBLCH to the H level to turn on the transistor 34. When a non-volatile memory cell has data of 0, the potential of the node N1 changes to the L level due to current flowing through the transistors 33 and 34. The potential of the node N2 becomes the H level.

However, when the non-volatile memory cell is in the erased state or when it has a negative threshold voltage even through it has data "0," current does not flow in the node N1 and the node N1 is at the H level. Similarly, the potential of the node N2 is at the L level.

The control circuit 20 precharges the data read line DO to the H level. The column decoder 15 sets the column address signal YR to the H level to select the page buffer PB corresponding to an input address. As a result, the transistor 43 is turned on and the data read line DO changes to the L level since the node N2 is at the H level and the transistor is in the on-state when the non-volatile memory cell has data "0." The I/O circuit 17 outputs data of the L level as data "0" (which is denoted by Read_Pass in FIG. 5). However, when the non-volatile memory cell has data "1," the node N2 is at the L level and the transistor is in the off-state, the data read line DO is maintained at the H level. The I/O circuit 17 outputs data of the H level as data "1." When data "1" has been written to the non-volatile memory cell in a write operation (i.e., when the non-volatile memory cell is originally in the erased state), data "1" is read as data "1" (which is denoted by Read_Pass in FIG. 5). When the non-volatile memory cell is still in the erased state (i.e., when the threshold voltage of the non-volatile memory cell is negative) even through data "0" has been written to the non-volatile memory cell in the write operation, data "1" is read (which is denoted by Read_Fail in FIG. 5).

Thereafter, the row decoder 14 changes the selected word line and the unselected word lines to 0 V, thereby terminating the read operation. In addition, the control circuit 20 changes the control signal PBLCH to the L level, thereby terminating the operation of the latch LT. The control circuit 20 also changes the control signal pDis to the H level while maintaining the control signal BLSHF at the H level, thereby discharging the bit line BL. After discharging the bit line BL, the control circuit 20 changes the control signals pDis and BLSHF to the L level to disconnect the node SO from the bit line BL, thereby terminating the read operation.

Erase-Verify Operation

In an erase-verify operation, an erase operation is performed on all non-volatile memory cells in a selected memory cell block BLC and then whether data has been normally erased is determined with respect to each memory cell block BLC. In detail, command data instructing to perform an erase operation on a memory cell block BLC is input to the non-volatile memory device 10 and data indicating an erase mode is set in the command register 18. Based on the set data, the control circuit 20 controls the voltage generation circuit to generate an erase voltage necessary to erase data from non-volatile memory cells and apply the erase voltage (i.e., apply a stress to perform erasing) to the non-volatile memory cells in a selected memory cell block BLC.

Erasing data from all of the non-volatile memory cells in the selected memory cell block BLC to which the erase voltage is applied is performed in bulk. After the erase operation is performed on the selected memory cell block BLC, data indicating an erase-verify mode is set in the command register 18. The control circuit 20 outputs a control signal to control each circuit based on the data. In an initial state, the control circuit 20 sets the control signals PBLCH, pPGM, BLSHF, and pDis to an L level and the control signals pLOAD and PBRST to an H level. The column decoder 15 sets the column address signals YW and YR to an L level.

The control circuit 20 changes the control signal PBRST to the L level to forcefully apply data of the H level to the node N1, thereby performing a reset operation to prepare to read data from a non-volatile memory cell. As a result, the data of the H level is written to the node N1 and data of the L level is written to the node N2 in the latch LT, so that reset data is stored in the latch LT. The control circuit 20 changes the control signal PBRST to the H level to turn off the transistor 32 and finishes the reset operation regarding RESET_STATE as illustrated in FIG. 5.

Thereafter, the control circuit 20 changes the control signal pLOAD to the L level and the control signal BLSHF to the H level. As a result, the transistors 31 and 41 are turned on and the bit line BL is precharged to the H level through the transistors 31 and 41.

Thereafter, the control circuit 20 controls the row decoder 14 to apply the write-inhibit voltage Vpass to the internal selection gate signals GSSL and GSGL and 0 V to the internal word signals GWL0 through GWL4. The selection gate signals SSL and SGL input to the selected memory cell block BLC become to have the write-inhibit voltage Vpass, so that a NAND cell string NA is connected to the bit line BL. Regardless of being selected or not, 0 V is applied to the word lines WL0 through WL4 in the selected memory cell block BLC.

The control circuit 20 changes the control signal pLOAD to the H level and the control signal BLSHF to the L level. As a result, when all of non-volatile memory cells in the NAND cell string NA connected to the bit line BL are in the on-state, the NAND cell string NA becomes conductive, and therefore, the bit line BL becomes a ground level, i.e., the L level. However, when data "0" is not erased from any one of the non-volatile memory cells in the NAND cell string NA connected to the bit line BL, the non-volatile memory cell is not turned on and the NAND cell string NA is not conductive. As a result, the bit line BL is in a precharged state, i.e., is at the H level. The node SO is at the H level when the bit line BL is at the H level since the non-volatile memory cell has data "0" and it changes from the H level to the L level when the bit line BL is at the L level since the data is erased from the non-volatile memory cell.

Thereafter, the control circuit 20 changes the control signal BLSHF to the H level. As a result, the transistor 41 is turned on and the bit line BL is connected to the node SO, and therefore, the node SO has the same potential as the bit line BL. Thereafter, the control circuit 20 changes the control signal PBLCH to the H level to turn on the transistor 34. Accordingly, when data "0" has been erased from all non-volatile memory cells in the NAND cell string NA, the potential of the node SO is at the L level, and therefore, the nodes N1 and N2 are at the H and L levels, respectively, in the latch LT. However, when data is not erased from any one of the non-volatile memory cells in the NAND cell string NA, the potential of the node SO is at the H level and the nodes N1 and N2 are at the L and H levels, respectively, in the latch LT.

Until data indicating whether data "0" is erased from all non-volatile memory cells in the NAND cell string NA in the selected memory cell block BLC is read from the latch LT of each of all page buffers PB, the control circuit 20 precharges the data read line DO to the H level. The column decoder 15 sets the column address signal YR to the H level to select a page buffer PB corresponding to an input address.

Accordingly, the transistor 43 is turned on and the node N2 is at the L level and the transistor 44 is in the off-state when data "0" is erased from all non-volatile memory cells in the NAND cell string NA, and therefore, the data read line DO is maintained at the H level. The data of H level is input to the control circuit 20 (which is denoted by EraseVerify_Pass). However, when there is any one non-volatile memory cell from which data has not been erased among the non-volatile memory cells in the NAND cell string NA, the node N2 is at the H level and the transistor 44 is in the on-state, and therefore, the data read line DO changes to the L level. The data of the L level is input to the control circuit 20 (which is denoted by EraseVerify_Fail).

The column address is changed one by one during the read operation. In other words, the column decoder 15 changes the column address signal YR generated from the column address to select the page buffers PB one by one and data is read from the latch LT of the selected page buffer PB in repetitive operations.

When a signal output from every page buffer PB to the data read line DO is at the H level, the control circuit 20 determines that the erase operation has been completed normally and terminates the erase-verify operation. However, a signal output from any one of the page buffers PB to the data read line DO is at the L level, the erase operation and the erase-verify operation are newly performed.

In the erase-verify operation after the newly performed erase operation, data in the latch LT in each page buffer PB is reset. Accordingly, the node N1 is at the H level and the node N2 is at the L level in the reset state. Until the control circuit 20 determines that the erase operation is normally completed or until the number of erase operations reaches a predetermined value, the erase operation and the erase-verify operation are repeated.

The row decoder 14 changes all word lines WL0 through WL4 to 0 V to terminate the erase-verify operation. In addition, the control circuit 20 changes the control signal PBLCH to the L level to terminate the operation of the latch LT. Also, the control circuit 20 changes the control signal pDis to the H level while maintaining the control signal BLSHF at the level to discharge the bit line BL. After discharging the bit line BL, the control circuit 20 changes the control signals pDis and BLSHF to the H level to disconnect the node SO from the bit line BL, thereby terminating the erase-verify operation.

Write Operation

In a write operation, data is written from the data write line nDI to the latch LT of the page buffer PB and data "0" or "1" is written to a non-volatile memory cell using the data written to the latch LT. In detail, in the write operation, command data indicating the write operation is externally input to the non-volatile memory device 10 and data indicating a write mode is set in the command register 18. The control circuit 20 outputs a control signal to control each circuit based on the data. In an initial state, the control circuit 20 sets the control signals PBLCH, pPGM, BLSHF, and pDis to an L level and the control signals pLOAD and PBRST to an H level. The column decoder 15 sets the column address signals YW and YR to an L level.

The control circuit 20 changes the control signal pLOAD to the L level and the control signal PBLCH to the H level. As a result, the transistor 31 is turned on and the node SO is at the H level, and therefore, the transistor 33 is also turned on. Since the transistor 34 is turned on, data of the L level is forcefully applied to the node N1, so that the reset operation is performed to prepare to write data to a non-volatile memory cell. As a result, the data of the L level is written to the node N1 and data of the H level is written to the node N2 in the latch LT, so that reset data is stored in the latch LT.

The control circuit 20 changes the control signal pLOAD to the H level and the control signal PBLCH to the L level to turn off the transistors 31 and 34 and finishes the reset operation regarding RESET_STATE as illustrated in FIG. 5.

The column decoder 15 outputs the column address signal YW to turn on the transistor 38. Next, the control circuit 20 controls the I/O circuit 17 to write external data "0" or "1" to a non-volatile memory cell. The I/O circuit 17 sets the data write line nDI to an H or L level in response to the external data of "0" or "1," respectively. When the data write line nDI is set to the H level to write the data "0," the node N1 becomes the H level and the node N2 becomes the L level in the latch LT. However, when the data write line nDI is set to the L level to write the data "1," the node N1 is at the L level and the node N2 is at the H level in the latch LT, which is the same as the initial state (denoted by INHIBIT in FIG. 5).

During the write operation, writing data to the latch LT of the page buffer PB is performed with a column address changed one by one. In other words, the column decoder 15 changes the column address signal YW generated from the column address to select the page buffers PB one by one and data is written to the latch LT of the selected page buffer PB in repetitive operations.

The control circuit 20 changes the control signals pPGM and BLSHF to the H level. As a result, the transistors 40 and 41 are turned on, so that the bit line BL connected to a NAND cell string NA including a non-volatile memory cell to which data "0" will be written is maintained at 0 V. However, the bit line BL connected to a NAND cell string NA including a non-volatile memory cell to which data "1" will be written (i.e., a non-volatile memory cell which will be maintained in the erased state) is precharged to the H level.

The row decoder 14 selects one of a plurality of memory cell blocks BLC and applies the program voltage Vpgm to a selected word line in the selected memory cell block BLC. The row decoder 14 also applies the write-inhibit voltage Vpass to unselected word lines other than the selected word line.

As a result, the source, drain and channel of the non-volatile memory cell, which is connected to the selected word line and to which data "0" will be written, are at the L level, and therefore, electrons are injected to the floating gate of the non-volatile memory cell. Accordingly, the threshold voltage of the non-volatile memory cell increases so that data "0" is written to the non-volatile memory cell. Since the source, drain and channel of the non-volatile memory cell to which data "1" will be written are at the H level, electrons are not injected to the floating gate of the non-volatile memory cell and data "1" is maintained in the non-volatile memory cell. Thereafter, the row decoder 14 changes the selected and unselected word lines to 0 V to terminate the write operation. In addition, the control circuit 20 changes the control signals pPGM and BLSHF to the L level to disconnect the bit line BL from the node SO and disconnect the latch LT from the node SO, thereby terminating the write operation.

Write-Verify Operation

In a write-verify operation, the control circuit 20 reads data from a non-volatile memory cell through a page buffer PB in order to determine whether data has been normally written to the non-volatile memory cell. In detail, when reading data from the non-volatile memory cell, the control circuit 20 changes the control signal pLOAD to the L level and the control signal BLSHF to the H level. As a result, the transistors 31 and 41 are turned on and the bit line BL is precharged to the H level through the transistors 31 and 41.

The row decoder 14 applies 0 V to the selected word line and the read voltage Vread generated by the voltage generation circuit 16 to the unselected word lines so as to turn on all non-volatile memory cells whose gates are connected to the unselected word lines, respectively.

Thereafter, the control circuit 20 changes the control signal pLOAD to the H level and the control signal BLSHF to the L level. When a non-volatile memory cell whose gate is connected to the selected word line has data "0," the bit line BL is not discharged but is maintained at the H level. However, when the non-volatile memory cell has data "1" (i.e., when the non-volatile memory cell is in the erased state or when the non-volatile memory cell has a negative threshold voltage even though data "0" has been written to the non-volatile memory cell), the bit line BL is discharged and thus changes to the L level.

Thereafter, the control circuit 20 changes the control signal BLSHF to the H level. As a result, the transistor 41 is turned on and the node SO is connected to the bit line BL, so that the node SO has the same potential as the bit line BL. Furthermore, the control circuit 20 changes the control signal PBLCH to the H level to turn on the transistor 34.

Accordingly, when data "0" has been written to a non-volatile memory cell to which data "0" was supposed to be written, the node SO is at the H level, and therefore, the node N1 changes to the L level and the node N2 changes to the H level in the latch LT. However, when data "0" has not been written to the non-volatile memory cell to which data "0" was supposed to be written, the node SO is at the L level, and therefore, the latch LT is not inverted. As a result, the node N1 is maintained at the H level and the node N2 is maintained at the L level in the latch LT, so that the latch LT remains in a state opposite to a written state (i.e., RESET_STATE). When data "1" has been written to the non-volatile memory cell, the latch LT remains in the initial state even though the node SO changes to the L level, and therefore, the node N1 is at the L level and the node N2 is at the H level in the latch LT, that is, the latch LT remains in the reset state RESET_STATE.

When data is read from non-volatile memory cells on the selected word line in the selected memory cell block BLC to the latches LT of all page buffers PB, the control circuit 20 has precharged the data read line DO to the H level. The column decoder 15 changes the column address signal YR to the H level to select a page buffer PB corresponding to an input address.

As a result, the transistor 43 is turned on. When data "0" has been written to the non-volatile memory cell, the node N2 is at H level and the transistor is in the on-state, the data read line DO changes to the L level. The data of L level is input to the control circuit 20 (which is denoted by WriteVerify_Pass in FIG. 5).

When the non-volatile memory cell does not have data "0" even though data "0" has been written to the non-volatile memory cell in the write operation (i.e., when the non-volatile memory cell has a negative threshold voltage), the node N2 is at the L level and the transistor 44 is in the off-state, and therefore, the data read line DO is at the H level. The data of the H level is input to the control circuit 20 (which is denoted by WriteVerify_Fail in FIG. 5).

When the non-volatile memory cell has data "1," the node N2 is at the H level and the transistor 44 is in the on-state, and therefore, the data read line DO changes to the L level. The data of the L level is input to the control circuit 20 (which is denoted by WriteVerify_Pass in FIG. 5).

The column address is changed one by one during the write-verify operation. In other words, the column decoder 15 changes the column address signal YR generated from the column address to select the page buffers PB one by one and data is read from the latch LT of the selected page buffer PB to the data read line DO in repetitive operations.

When a signal output from every page buffer PB to the data read line DO is at the H level, the control circuit 20 determines that the write operation has been completed normally and terminates the write-verify operation. However, a signal output from any one of the page buffers PB to the data read line DO is at the H level, the write operation and the write-verify operation are newly performed.

At this time, the write and the write-verify operations are newly performed without resetting the data in the latch LT of each page buffer PB. In the write-verify operation after the newly performed write operation, the node N1 is at level L and the node N2 is at the H level (which corresponds to the reset state). Until the control circuit 20 determines that the write operation is normally completed or until the number of write operations reaches a predetermined value, the write operation and the write-verify operation are repeated.

The row decoder 14 changes all selected and unselected word lines to 0 V to terminate the write-verify operation. In addition, the control circuit 20 changes the control signal PBLCH to the L level to terminate the operation of the latch LT. Also, the control circuit 20 changes the control signal pDis to the H level while maintaining the control signal BLSHF at the H level to discharge the bit line BL. After discharging the bit line BL, the control circuit 20 changes the control signals pDis and BLSHF to the H level to disconnect the node SO from the bit line BL, thereby terminating the write-verify operation.

The structure and the operations of each page buffer PB have been described above. The above-described write operation, write-verify operation and erase-verify operation correspond to an operation of reading data from a memory cell (i.e., a data read operation) in the exemplary embodiments of the present general inventive concept. In the data read operation, the control circuit 20 monitors the potential of the common source line CSL in the selected memory cell block BLC and changes a first start time of the control signal BLSHF and a first start time of the control signal PBLCH after the bit line precharge operation according to the monitored potential. In order to perform the above operation, the control circuit 20 includes the differential amplifier 20a, the timer 20b, and the core controller 20c.

A positive input terminal of the differential amplifier 20a is connected to the voltage generation circuit 16 to receive a reference voltage VREF_CSL. The inverting input terminal of the differential amplifier 20a is connected to the global common source line GCSL and the common source line CSL of the selected memory cell block BLC to receive a voltage of the common source line CSL. The differential amplifier 20a is enabled by an enable control signal (not illustrated) received from the core controller 20c and drives a comparison result signal CSLDetect, which drives the timer 20b, to an H level when the reference voltage VREF_CSL is higher than or equal to the voltage of the common source line CSL. When the reference voltage VREF_CSL is lower than the voltage of the common source line CSL, the differential amplifier 20a maintains the comparison result signal CSLDetect at the L level. The core controller 20c changes the control signal BLSHF to an L level after the bit line precharge operation and then outputs the enable control signal to the differential amplifier 20a. Therefore, the differential amplifier 20a detects the potential of the common source line CSL while the potential of the common source line CSL decreases after being increased.

The timer 20b may be implemented by a ring oscillator so that it starts counting time when receiving the comparison result signal CSLDetect at the H level from the differential amplifier 20a and then outputs a time detect signal to the core controller 20c after a certain time. There are a plurality of time detect signals in the embodiments of the inventive concept. For instance, after receiving the comparison result signal CSLDetect, the timer 20b sequentially outputs a first time detect signal and a second time detect signal by changing the signal level from an L level to an H level.

When the first time detect signal is at the H level, the core controller 20c changes the control signal BLSHF from the L level to the H level, similarly as done during the bit line precharge operation. The core controller 20c also changes the control signal PBLCH from the L level to the H level when the second time detect signal is at the H level.

The reference voltage VREF_CSL and the certain time are preset during the design of the non-volatile memory device 20. The reference voltage VREF_CSL and the certain time which have been preset during the design may be adjusted based on a result of a test performed after the design. For instance, an optimal reference voltage or certain time may be set in the command register 18 through the I/O circuit 17 and the differential amplifier 20a and the timer 20b may output the comparison result signal CSLDetect and the time detect signal based on the value set in the command register.

The operation of monitoring the common source line CSL while data is being read from a memory cell in exemplary embodiments of the present general inventive concept will be described in detail by explaining a write-verify (i.e., a program-verify) operation below.

Figure 6A:
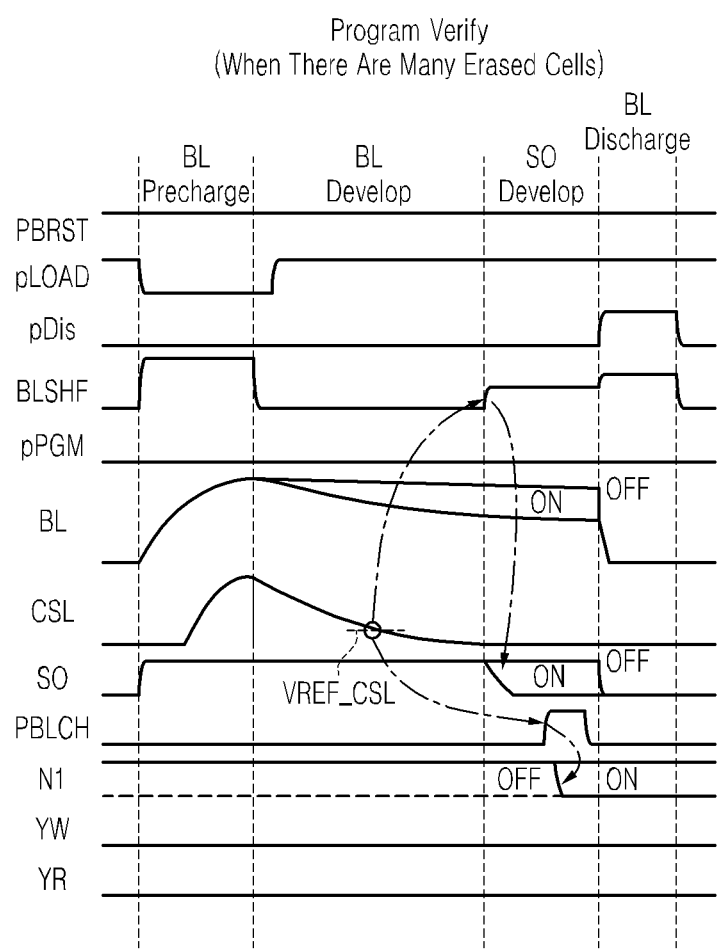
FIGS. 6A and 6B are timing charts illustrating an operation of a page buffer in a write-verify mode according to an exemplary embodiment of the present general inventive concept.
Figure 6B:
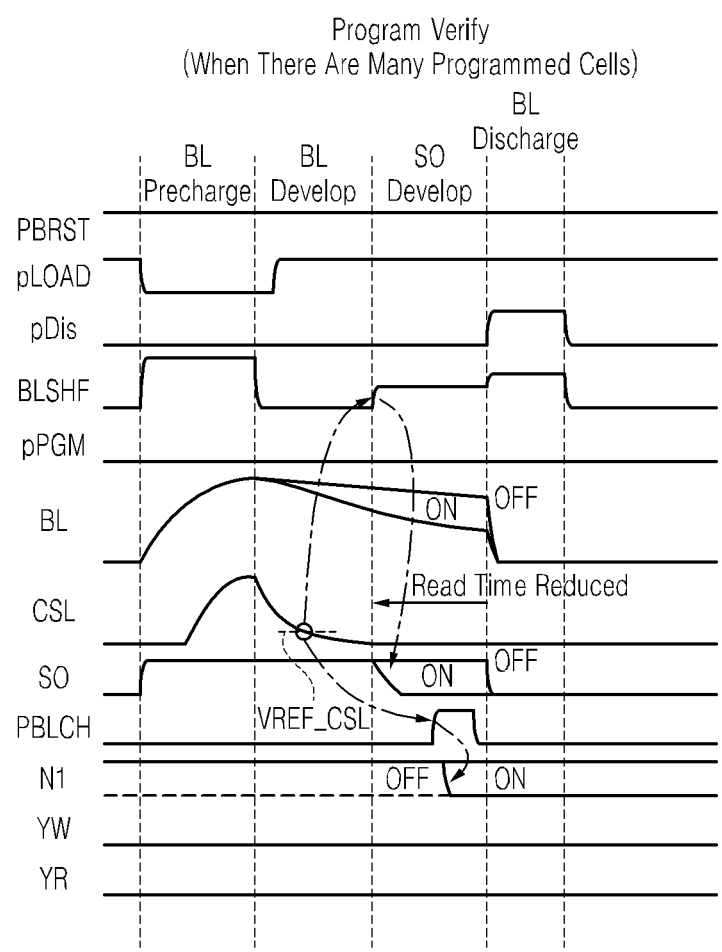

FIGS. 6A and 6B are timing charts illustrating the write-verify operation according to an exemplary embodiment of the present general inventive concept. FIG. 6A illustrates waveforms of main signals of a page buffer PB when there are a small number of write-verify operations and many erased cells. FIG. 6B illustrates waveforms of the main signals of the page buffer PB when there are a large number of write-verify operations and many programmed cells.

In FIGS. 6A and 6B, the write-verify operation is divided into four periods. A first period corresponds to a precharging of a bit line (hereinafter, referred to as a BL precharge period). A second period corresponds to a discharging of the bit line (hereinafter, referred to as a BL develop period). A third period corresponds to a detection of the latch LT and data output from the page buffer PB (hereinafter, referred to as a SO develop period). A fourth period corresponds to a discharging of the voltage of the bit line (hereinafter, referred to as a BL discharge period).

During the BL precharge period, the control circuit 20 changes the control signal BLSHF to H level and the control signal pLOAD to L level, thereby precharging a bit line BL to the H level. Thereafter, when the row decoder 14 selects a word line, the bit line BL is charged and simultaneously current flows from the bit line BL to the common source line CSL in each of NAND cell strings NA. However, the potential of the common source line CSL increases due to the limit in size of the transistor 21a and the wiring resistance of the common source line CSL.

During the BL develop period, the control circuit 20 changes the control signal BLSHF to the L level in order to turn off the transistor 41 and electrically disconnect the page buffer PB from the bit line BL. When a selected memory cell is an erased cell (i.e., an on-cell) in each NAND cell string NA, the selected memory cell discharges the bit line BL connected thereto to the L level. However, when the selected memory cell is a programmed cell (i.e., an off-cell), the memory cell does not discharge the corresponding bit line BL so that the potential of the bit line BL is maintained at the precharged level, i.e., the H level. An amount of current flowing in the common source line CLS is greater when there are a lot of on-cells, as illustrated in FIG. 6A, as compared with an instance when there a lot of off-cells, as illustrated in FIG. 6B. As such, the potential of the common source line CSL decreases more slowly in FIG. 6A than in FIG. 6B.

During the SO develop period, when the potential of the common source line CSL is lower than the reference voltage VREF_CSL, the control circuit 20 changes the control signal (or first control signal) BLSHF to the H level a predetermined period of time after a time point when the potential of the common source line CSL becomes lower than the reference voltage VREF_CSL, so as to turn on the transistor 41 and connect the bit line BL to the node SO of the page buffer PB. As a result, data from the memory cell is input to the page buffer PB. Since the potential of the common source line CSL decreases more quickly in FIG. 6B than in FIG. 6A, the potential of the common source line CSL reaches the reference voltage VREF_CSL more quickly. Accordingly, the data from the memory cell is input to the page buffer PB more quickly in FIG. 6B than in FIG. 6A.

The potential of the node SO changes to the L level to be similar to the potential of the bit line BL when the memory cell is an on-cell. However, the potential of the node SO remains at the H level, similar to the potential of the bit line BL when the memory cell is an off-cell.

Next, the control circuit 20 changes the control signal (or second control signal) PBLCH to the H level a predetermined period of time after the time point when the potential of the common source line CSL becomes lower than the reference voltage VREF_CSL so as to turn on the transistor 34 and detect the potential of the node SO, i.e., the potential of the bit line BL using the latch LT. Therefore, the data read from the memory cell is detected in the page buffer PB.

When the potential of the node SO is at the H level, the potential of the node N1 is at the L level and the potential of the node N2 is at the H level, so that the memory cell is detected as an off-cell. However, when the memory cell is still an on-cell even though the memory cell has been programmed to be an off-cell, the potential of the node SO is at the L level, and therefore, the potential of the node N1 is at the H level and the potential of the node N2 is at the L level. As a result, the memory cell is detected as an off-cell.

During the BL discharge period, after the row decoder 14 sets a selected word line to the L level, the control circuit 20 boosts the control signal BLSHF to a higher voltage level so as to reduce impedance of the transistor 41 between the node SO and the bit line BL and change the control signal pDis to the H level, so that the transistor 42 is turned on. Therefore, the potential of the bit line BL is discharged to 0 V, which terminates a single program loop.

As described above, the non-volatile memory device 10 includes the control circuit 20 that changes a data input time as data is transferred from the bit line BL to the page buffer PB and the data detection time of the latch LT according to the voltage level of the common source line CSL connected in common to sources of a plurality of bit lines BL, while data is being read from memory cells. Therefore, the data input time as data is input to the page buffer PB and the detection time of the latch LT may be changed depending on the number of 1s in a selected page. Accordingly, an amount of incorrect data input to the latch LT of the page buffer PB is reduced. As a result, the non-volatile memory device 10 adjusts the timing of the SO develop period of the latch LT depending on the number of 1s (i.e., the number of on-cells) in a page.

In particular, as described with reference to FIGS. 6A and 6B, the read data input time from a memory cell to the page buffer PB and the data detection start time of the latch LT can be sped up when many cells are programmed by repeating the program loop of a write operation and a write-verify operation. Accordingly, a total program time can be reduced. In addition, since an amount of time to satisfactorily lower the potential of the common source line CSL is reduced, a time during which leakage current flows in an off-cell is also reduced, thereby reducing a total leakage current.

As described above, according to exemplary embodiments of the present general inventive concept, a non-volatile memory device includes a controller that changes a time at which data from a bit line is input into a page buffer and a time at which a latch starts detecting the input data according to the voltage level of a common source line connected in common to the sources of a plurality of bit lines while data is being read from a memory cell. Therefore, the non-volatile memory device can adjust the timing of a SO develop period (i.e., a period corresponding to a detection of a latch LT and data output from the page buffer PB) of a latch corresponding to a page depending on the number of 1s (i.e., on-cells) in the page, thereby preventing incorrect data from being written to the latch.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A non-volatile memory device, comprising:
a memory cell array in which a plurality of bit lines intersect a plurality of word lines and a non-volatile memory cell is disposed at each intersection;
a page buffer which is provided for each bit line and which comprises a latch configured to store data to be written to a memory cell connected to a word line selected from among the plurality of word lines or data read from the memory cell; and
a control circuit configured to control a data input time from the bit line to the page buffer and a data detection time of the latch according to a voltage level of a common source line connected to sources of the respective bit lines during an operation of reading data from the memory cell.

2. The non-volatile memory device of claim 1, wherein the operation of reading the data from the memory cell is a read operation in a write-verify operation performed to determine whether the data has been written to the memory cell.

3. The non-volatile memory device of claim 1, wherein the control circuit comprises:
a differential amplifier configured to compare a potential of the common source line with a predetermined reference voltage and to output a detection signal;
a timer configured to measure time in response to the detection signal received from the differential amplifier and to output a time signal after a certain time; and
a core controller configured to output a first control signal instructing data input from each bit line to the page buffer and a second control signal instructing to detect the input data using the latch when receiving the time signal from the timer.

4. The non-volatile memory device of claim 3, further comprising a register configured to store the reference voltage and the certain time as a result of testing the semiconductor memory device after being manufactured.

5. A non-volatile memory device, comprising:
a memory cell array comprising a plurality of non-volatile memory cells connected to a plurality of bit lines and a plurality of word lines;
a page buffer which is provided for each bit line and which comprises a latch configured to latch data to be written to a memory cell connected to a word line selected from among the plurality of word lines or data read from the memory cell; and
a control circuit configured to control a latching time of the latch according to a voltage level of a common source line connected to sources of the respective bit lines during an operation of reading data from the memory cell.

6. The non-volatile memory device of claim 5, wherein the page buffer further comprises:
a first node; and
a first switch disposed between the bit line and the first node to control connection and disconnection between the bit line and the first node in response to a first control signal.

7. The non-volatile memory device of claim 6, wherein control circuit comprises:
a comparator configured to compare a potential of the common source line with a predetermined reference voltage and to output a detection signal;
a timer configured to measure time in response to the detection signal received from the comparator and to output a first time signal after a first time; and
a core controller configured to output the first control signal when receiving the first time signal from the timer.

8. The non-volatile memory device of claim 7, wherein the page buffer further comprises:
a transistor connected between an input node of the latch and the first node; and
a second switch connected to the transistor to be turned on or off in response to a second control signal.

9. The non-volatile memory device of claim 8, wherein the timer measures time in response to the detection signal received from the comparator and outputs a second time signal after a second time,
the core controller outputs the second control signal when receiving the second time signal from the timer, and
the second time is greater than the first time.

10. The non-volatile memory device of claim 5, wherein the operation of reading the data from the memory cell comprises at least one operation among a read operation in a write-verify operation performed to determine whether the data has been written to the memory cell, an operation of reading the data from the memory cell, and a read operation in an erase-verify operation performed to determine whether the data written to the memory cell has been erased.

11. A non-volatile memory device, comprising:
a memory cell array comprising at least one memory cell block including a plurality of non-volatile memory cells connected to a plurality of bit lines and a plurality of word lines;
a plurality of page buffers to each correspond to a respective bit line from among the plurality of bit lines and each comprising a latch to store data to be written to one of the plurality of non-volatile memory cells; and
a control circuit to control a data input time from one of the plurality of non-volatile memory cells to one of the plurality of page buffers and a data detection time of the latch based on a number of programmed memory cells or a number of erased memory cells.

12. The non-volatile memory device of claim 11, wherein during a read operation, the control circuit monitors a potential of a common source line (CSL) in a selected memory cell block in order to change the data input time according to the monitored potential.

13. The non-volatile memory device of claim 12, wherein if the number of programmed memory cells is greater than a predetermined threshold, a rate at which the potential of the CSL reaches the predetermined reference voltage increases to increase a rate of data input from the one of the plurality of non-volatile memory cells to the one of the plurality of page buffers.

14. The non-volatile memory device of claim 12, wherein the controller controls the data to be input from a selected one of the plurality of memory cells into the one of the plurality of page buffers when a potential of the common source line is below a predetermined reference voltage.

15. The non-volatile memory device of claim 12, wherein at least one memory cell block comprises a plurality of cell strings, each of the cell strings including memory cells connected in series, and the CSL is connected to each of the plurality of cell strings.

16. The non-volatile memory device of claim 11, wherein the control circuit comprises:
a differential amplifier to compare a potential of a common source line (CSL) with a predetermined reference voltage and to output a detection signal;
a timer to measure time in response to the detection signal received from the differential amplifier and to output a time signal after a predetermined time; and
a core controller to receive the time signal and to output a first control signal to control the data to be input from the one of the plurality of memory cells to the one of the plurality of page buffers and to output a second control signal instructing to detect the input data using the latch when receiving the time signal from the timer.

17. The non-volatile memory device of claim 16, wherein each of the plurality of page buffers comprises:
 a first node; and
 a first switch disposed between one of the plurality of bit lines and the first node to control a connection and disconnection between the one of the plurality of bit lines and the first node in response to the first control signal.

18. The non-volatile memory device of claim 17, wherein each of the plurality of page buffers further comprises:
 a transistor connected between an input node of the latch and the first node; and
 a second switch connected to the transistor to be turned on or off in response to the second control signal.

19. The non-volatile memory device of claim 18, wherein the page buffer is disconnected from the bit line when the first switch is turned off.

20. The non-volatile memory device of claim 11, wherein the plurality of bit lines intersect the plurality of word lines and one of the plurality of non-volatile memory cells is disposed at each intersection.

\* \* \* \* \*